United States Patent
Choi

(10) Patent No.: US 6,929,298 B2
(45) Date of Patent: Aug. 16, 2005

(54) WAFER TRANSFER APPARATUS AND DEVICE AND METHOD FOR CLEANING ROBOT ARM IN WAFER TRANSFER APPARATUS

(75) Inventor: Young-Man Choi, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 87 days.

(21) Appl. No.: 10/330,214

(22) Filed: Dec. 30, 2002

(65) Prior Publication Data

US 2004/0000796 A1 Jan. 1, 2004

(30) Foreign Application Priority Data

Jun. 28, 2002 (KR) ....................... 2002-36616

(51) Int. Cl.[7] ............................................. B25J 15/06
(52) U.S. Cl. .................... 294/64.1; 414/941; 901/40
(58) Field of Search ........................... 294/64.1, 64.2, 294/64.3, 65; 901/40; 414/627, 737, 752.1, 941; 438/692

(56) References Cited

U.S. PATENT DOCUMENTS

| | | | | |
|---|---|---|---|---|
| 2,999,715 A | * | 9/1961 | Firestone | .................. 294/64.1 |
| 3,219,380 A | * | 11/1965 | Carliss | ....................... 294/64.1 |
| 4,773,687 A | * | 9/1988 | Bush et al. | ................. 294/64.1 |
| 4,858,975 A | * | 8/1989 | Ogawa | ....................... 294/64.1 |
| 5,188,411 A | * | 2/1993 | Golden | ....................... 294/64.2 |
| 5,451,086 A | * | 9/1995 | Pazzaglia | .................... 294/64.1 |
| 5,622,400 A | * | 4/1997 | George | ....................... 294/64.1 |
| 5,915,910 A | * | 6/1999 | Howells et al. | ......... 414/331.17 |
| 6,068,316 A | * | 5/2000 | Kim et al. | .................. 294/64.1 |

\* cited by examiner

*Primary Examiner*—Dean J. Kramer
(74) *Attorney, Agent, or Firm*—Volentine Francos & Whitt, PLLC

(57) ABSTRACT

A wafer transfer apparatus includes a robot arm and a robot arm cleaning device that injects purge gas into a vacuum nozzle of the robot arm under a normal stand-by state wherein the robot arm does not suction a wafer, to clean the vacuum nozzle. The robot arm cleaning device comprises a solenoid valve adapted to supply and intercept air, a first air valve adapted to selectively maintain and release a vacuum state in response to the air supplied from the solenoid valve, and a second air valve adapted to selectively supply and intercept a purge gas in response to the air supplied from the solenoid valve. The robot arm holds a wafer by a vacuum state of the vacuum nozzle when the first air valve is opened, and the vacuum nozzle is cleaned by the purge gas supplied when the second air valve is opened.

9 Claims, 1 Drawing Sheet

WAFER TRANSFER APPARATUS AND DEVICE AND METHOD FOR CLEANING ROBOT ARM IN WAFER TRANSFER APPARATUS

CROSS REFERENCES TO RELATED APPLICATIONS

This application claims priority under 35 U.S.C. § 119 from Korean Patent Application No. 2002-0036616, filed on Jun. 28, 2002, the contents of which are hereby incorporated by reference in their entirety as if fully set forth herein.

BACKGROUND AND SUMMARY

1. Technical Field

The present invention relates to a wafer transfer apparatus, and more particularly, to a robot arm cleaning device for cleaning a robot arm in a wafer transfer apparatus under a normal stand-by state when the robot arm does not adsorb or suction a wafer.

2. Description

In general, the tendency toward gradually increasing density and smaller sized semiconductor devices, and the tendency toward multi-layer wire structures in a semiconductor device, worsen the step coverage of the device. In order to improve the step coverage, several kinds of planarizing methods, such as an SOG (Spin on Glass), an Etch Back and a Reflow, etc., are being developed so as to be applied to a planarizing process of a wafer.

Such wafer planarizing processes include a mechanical polishing method and a chemical polishing method. In the mechanical polishing method, a characteristic of a polished layer is changed due to the mechanical polishing process, which can cause a defect on a semiconductor chip. In the chemical polishing method, although the changed-process layer is not formed thereon, a precisely flattened shape cannot be obtained very well. Therefore, a planarizing process is required to execute a polishing work by combining this mechanical polishing method with the chemical polishing method. Such a process is known as a chemical mechanical polishing (CMP) process.

For the CMP process, a wafer is installed on a polishing head by a vacuum or surface tension. During the process, the wafer is held between a polishing pad provided on a polishing table, and the polishing head applying a constant pressure to the wafer. The polishing pad rotates while simultaneously the polishing head rotates and oscillates.

The wafer surface and the polishing pad are in contact with each other by the weight of the polishing head and an applied pressurizing force. Slurry, used as a process fluid, moves into a small gap between the contacting faces of the polishing pad and the wafer. Polishing particles from the slurry and surface projections of the pad perform a mechanical removing operation. Meanwhile, a chemical component in the slurry also performs a chemical removing operation.

A CMP system includes a wafer storing unit having a cassette for accommodating wafers to be polished, a rinsing unit for rinsing and drying the polished wafers, and a wafer transfer apparatus for transferring the wafers between these process units.

The wafer transfer apparatus of such a CMP system is provided with a valve unit for controlling a vacuum On/Off operation, such a valve unit being illustrated in FIG. 1.

Referring to FIG. 1, the valve unit includes a solenoid valve 60 for supplying or cutting off air by an electric control, and an air valve 62 for maintaining or releasing a vacuum state by air supplied from the solenoid valve 60.

Under a normal stand-by state, when a robot arm 64 of the wafer transfer apparatus does not adsorb or suction the wafer, the solenoid valve 60 is closed and air is not supplied to the N/C (Normal Close) air valve 62. Therefore, a vacuum nozzle 66 of the robot arm 64 is not maintained in a vacuum state. When, at this time, the vacuum nozzle 66 is not maintained in a vacuum state, air flows in through the vacuum nozzle 66 to thus maintain an atmospheric pressure state.

However, when the wafer transfer apparatus transfers a wafer, the solenoid valve 60 is opened and air is supplied to the N/C (Normal Close) air valve 62. When air is supplied to the air valve 62, the air valve 62 is opened, and thereby the vacuum nozzle 66 of the robot arm 64 maintains a vacuum state to thus suction or adsorb the wafer.

Thus, the robot arm 64 in the wafer transfer apparatus adsorbs or suctions the wafer by using the vacuum nozzle 66 in a vacuum state. However, when not adsorbing the wafer, the vacuum nozzle 66 adopts an atmospheric state, not the vacuum state. Therefore, a problem occurs that an alien substance or fumes, etc. is deposited on or in the vacuum nozzle 66 and clogs up the vacuum nozzle 66.

Therefore, it is an object of the present invention to provide a wafer transfer apparatus having a robot arm cleaning device, and an associated method of cleaning the robot arm, in which a vacuum nozzle of the robot arm is prevented from being clogged up by alien substances or fumes etc. when in a normal stand-by state wherein a wafer is not being suctioned or adsorbed by the robot arm.

Another object of the present invention is to provide a wafer transfer apparatus having a robot arm cleaning device, and an associated method of cleaning the robot arm, in which a vacuum nozzle is prevented from being clogged up by injecting air into the vacuum nozzle of the robot arm when in a normal stand-by state wherein a wafer is not adsorbed or suctioned by the robot arm.

In one aspect of the invention, in a wafer transfer apparatus of a semiconductor fabricating apparatus, a robot arm cleaning device comprises a solenoid valve for supplying or intercepting air by an electrical control, a first air valve for performing a control to maintain or release a vacuum state by air supplied from the solenoid valve, a second air valve for supplying or cutting off $N_2$ gas by air supplied from the solenoid valve, and a robot arm, in which a wafer is adsorbed or suctioned by a vacuum state of a vacuum nozzle when the first air valve is opened, and in which the vacuum nozzle thereof is cleaned by the $N_2$ gas supplied thereto when the second air valve is opened.

To achieve one or more of these objects, a method of cleaning a robot arm of a wafer transfer apparatus of a CMP system includes releasing a vacuum state of the robot arm under a normal stand-by state when the robot arm does not adsorb or suction the wafer, and purging the vacuum nozzle of the robot arm with $N_2$ gas so as to eliminate any alien substance or fumes.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION

Hereinafter, preferred embodiments of the present invention will be described in detail with reference to the accompanying drawings.

In the inventive description, details of widely known functions or constructions will be omitted so as not to obscure unnecessarily the gist of the present invention.

Figure 1:
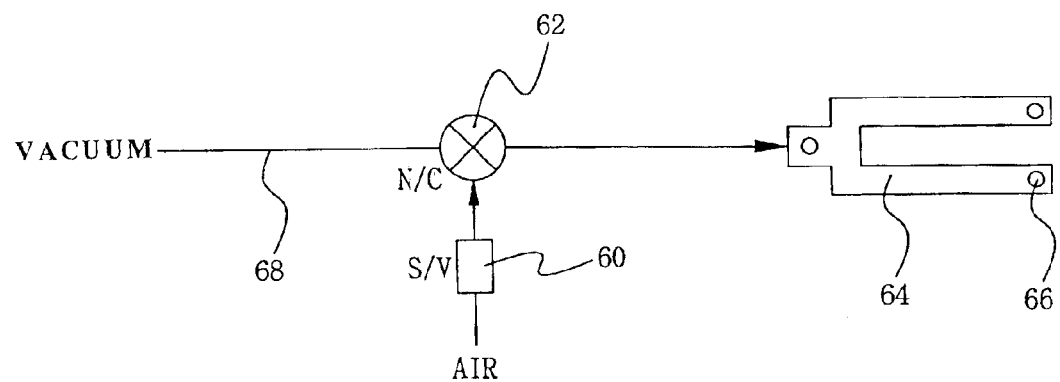
FIG. 1 is a schematic view of a conventional valve unit for controlling a vacuum On/Off operation of a robot arm in a wafer transfer apparatus.
Figure 2:
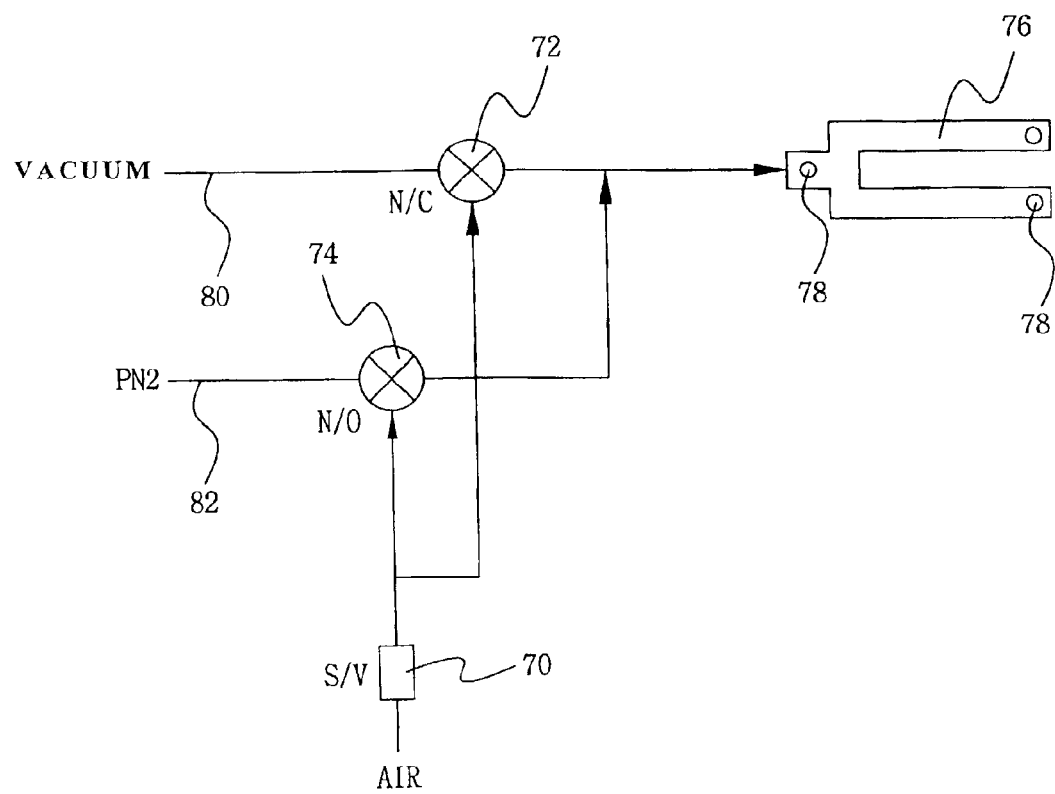
FIG. 2 is a schematic view illustrating an embodiment of a robot arm cleaning device in a wafer transfer apparatus.

FIG. 2 is a schematic view of one embodiment of a robot arm cleaning device of a wafer transfer apparatus.

With reference to FIG. 2, the robot arm cleaning device includes a solenoid valve 70 for supplying or intercepting air in response to an electrical control; a first air valve 72 for maintaining or releasing a vacuum state in response to air supplied from the solenoid valve 70; a second air valve 74 for supplying or cutting off a purge or cleaning gas (beneficially $N_2$) in response to the air supplied from the solenoid valve 70; and a robot arm 76 having a vacuum nozzle 78, which adsorbs or suctions a wafer by the vacuum state of the vacuum nozzle 78 when the first air valve 72 is opened, and which is cleaned by the purge or cleaning gas supplied when the second air valve 74 is opened.

An operation of this embodiment will be described in detail referring to FIG. 2, as follows.

In a normal stand-by state wherein the wafer transfer apparatus does not transfer a wafer, a robot arm 76 does not adsorb or suction a wafer. In that case, the solenoid valve 70 is "Off" and air is not supplied to the first and second air valves 72, 74. Since the first air valve 72 is a normal-closed (N/C) air valve, the vacuum nozzle 78 of the robot arm 76 does not maintain a vacuum state.

At this time, when the vacuum state is not maintained in the vacuum nozzle 78, since air is not supplied to the normal opened (N/O) second air valve 74, the valve 74 is open so that it supplies a purge or cleaning gas to the robot arm 76, and injects the purge or cleaning gas into the vacuum nozzle 78. The purge or cleaning gas injected into the vacuum nozzle 78 thereby removes any alien substance or fumes deposited within the vacuum nozzle 78, to prevent the vacuum nozzle 78 from being clogged up by air that may tend to try to flow in through the vacuum nozzle 78 so as to preserve an atmospheric pressure state and release the vacuum state. Beneficially, the purge or cleaning gas is $N_2$.

However, when the wherein the wafer transfer apparatus transfers a wafer, the wafer the robot arm 64 adsorbs or suctions a wafer. In that case, the solenoid valve 70 is "On" and supplies air to the first and second air valves 72, 74. When air is supplied to the first air valve 72, the first air valve 72 is opened, and when the first air valve 72 is opened, the vacuum nozzle 78 of the robot arm 76 maintains a vacuum state to adsorb or suction the wafer. In order that the robot arm 76 adsorbs or suctions the wafer, the solenoid valve 70 should be "On." When the solenoid valve 70 becomes "On," air is supplied to the first air valve 72 to open the first air valve 72. When the first air valve 72 is opened, the vacuum state in the vacuum nozzle 78 of the robot arm 76 is maintained to adsorb or suction the wafer. At this time, when air is supplied to the second air valve 74, it is closed and the purge or cleaning gas (beneficially, $N_2$) is not injected into the vacuum nozzle 78.

As aforementioned, in accordance with the present invention, there is an advantage of preventing a vacuum nozzle from being clogged up by using a purge or cleaning gas provided through the vacuum nozzle of a robot arm under a stand-by state when the wafer transfer apparatus does not transfer a wafer.

It will be apparent to those skilled in the art that various modifications and variations can be made in the present invention without deviating from the spirit or scope of the invention. Thus, it is intended that the present invention cover the modifications and variations of this invention provided they come within the scope of the appended claims and their equivalents.

What is claimed is:

1. A wafer transfer apparatus of a chemical mechanical polishing system, said apparatus comprising:

a solenoid valve adapted to supply and intercept air in response to an electric control;

a first air valve adapted to selectively maintain and release a vacuum state in response to the air supplied from the solenoid valve;

a second air valve adapted to selectively supply and intercept a purge gas in response to the air supplied from the solenoid valve; and a robot arm, in which a wafer is suctioned by a vacuum state of a vacuum nozzle when the first air valve is opened, and wherein the vacuum nozzle is cleaned by the purge gas supplied when the second air valve is opened.

2. The apparatus of claim 1, wherein said second air valve cuts off a supply of the purge gas to the robot arm when air is supplied from the solenoid valve.

3. The apparatus of claim 1, wherein said second air valve supplies the purge gas to the robot arm so as to clean the vacuum nozzle when air is not supplied from the solenoid valve.

4. The apparatus of claim 1, wherein said first air valve releases the vacuum state in a stand-by state wherein the robot arm does not suction the wafer.

5. The apparatus of claim 1, wherein the purge gas is $N_2$.

6. A method of cleaning a robot arm in a wafer transfer apparatus of a chemical mechanical polishing system, said method comprising:

closing a first valve to release a vacuum state of the robot arm under a normal stand-by state when the robot arm does not suction a wafer;

opening a second valve to inject a purge gas into a vacuum nozzle of the robot arm so as to eliminate an alien substance or fumes while the robot arm is under the normal stand-by state; and supplying air from a solenoid valve to the first and second valves to close the first valve and open the second valve.

7. The method of claim 6, wherein the purge gas is $N_2$.

8. A wafer transfer apparatus of a chemical mechanical polishing system, said apparatus comprising:

a robot arm having a nozzle adapted to hold a wafer by suction when in a vacuum state;

vacuum applying means adapted to selectively apply a vacuum state to the nozzle, said vacuum applying means including a first valve;

purge gas providing means adapted to selectively provide a purge gas to the nozzle, said purge gas providing means including a second valve; and control means for controlling the vacuum applying means and the purge gas providing means, wherein the control means is a solenoid valve adapted to selectively provide air to the vacuum applying means and the purge gas providing means in response to an external control signal, wherein when the robot arm is holding a wafer by suction, the vacuum applying means applies the vacuum state to the nozzle and the purge gas providing means does not provide the purge gas to the nozzle, and wherein when the robot arm is in a stand-by state not holding a wafer by suction, the vacuum applying means does not apply the vacuum state to the nozzle and the purge gas providing means does provide the purge gas to the nozzle.

9. The apparatus of claim 8, wherein the purge gas providing means is adapted to supply $N_2$ gas.

* * * * *